United States Patent
Ariesanti et al.

(10) Patent No.: US 9,797,065 B2
(45) Date of Patent: Oct. 24, 2017

(54) PROCESS OF FORMING A CRYSTAL HAVING A PARTICULAR SHAPE AND THE CRYSTAL FORMED BY THE PROCESS

(76) Inventors: Elsa Ariesanti, Watertown, MA (US); Douglas S. McGregor, Riley, KS (US)

(*) Notice: Subject to any disclaimer, the term of this patent is extended or adjusted under 35 U.S.C. 154(b) by 787 days.

(21) Appl. No.: 13/572,462

(22) Filed: Aug. 10, 2012

(65) Prior Publication Data

US 2013/0040095 A1 Feb. 14, 2013

Related U.S. Application Data

(60) Provisional application No. 61/574,862, filed on Aug. 10, 2011.

(51) Int. Cl.
| | |
|---|---|
| *C30B 25/16* | (2006.01) |
| *C30B 25/00* | (2006.01) |
| *C30B 29/12* | (2006.01) |
| *C30B 29/48* | (2006.01) |

(52) U.S. Cl.
CPC ............ *C30B 25/00* (2013.01); *C30B 25/165* (2013.01); *C30B 29/12* (2013.01); *C30B 29/48* (2013.01); *Y10T 428/24* (2015.01)

(58) Field of Classification Search
CPC ....... C30B 25/00; C30B 25/165; C30B 29/12; C30B 29/48; Y10T 428/24
See application file for complete search history.

(56) References Cited

U.S. PATENT DOCUMENTS

| | | | | |
|---|---|---|---|---|
| 4,282,057 | A | 8/1981 | Faile | |
| 5,892,227 | A * | 4/1999 | Schieber | G01T 1/24 250/370.12 |
| 2008/0156255 | A1* | 7/2008 | Basu | C30B 29/48 117/2 |
| 2009/0076294 | A1* | 3/2009 | Agnes | C30B 29/58 558/426 |
| 2010/0072382 | A1* | 3/2010 | Green et al. | 250/370.09 |

OTHER PUBLICATIONS

Vapor Growth of Tetragonal Prismatic Mercuric Iodide Crystals, Elsa Ariesanti, Alireza Kargar, Douglas S. McGregor, 2010 IEEE, 3739-3745.*

(Continued)

*Primary Examiner* — Michael Kornakov
*Assistant Examiner* — Hua Qi
(74) *Attorney, Agent, or Firm* — Abel Law Group, LLP

(57) ABSTRACT

A crystal can be formed using vapor deposition. In one set of embodiments, the crystal can be grown such that the crystal selectively grown along a particular surface at a relatively faster rate as compared to another surface. In another embodiment, the assist material may aid in transporting or depositing the vapor species of a constituent to surfaces of the crystal. In a further set of embodiments, the crystal can be vapor grown in the presence of an assist material that is attracted to or repelled from a particular location of the crystal to increase or reduce crystal growth rate at a region adjacent to the location. The position of the relatively locally greater net charge within the assist material may affect the crystal plane to which the assist material is attracted or repelled. An as-grown crystal may be achieved that has a predetermined geometric shape.

23 Claims, 5 Drawing Sheets

(56) References Cited

OTHER PUBLICATIONS

Semiconductor Materials and Radiological Technologies Laboratory, McGregor et al, 2010 Annual Report.*
A-Hgl2 Platelets Technology, Jan Przyluski and Jaroslaw Laskowski, Nuclear Instruments and Methods in Physics Research A283 (1989) 144-148.*
Przyluski, et al., Vapor Growth of Hgl 2 Crystals in Presence of Organic Additives, Mat. Res. Bull., vol. 19, pp. 189-196, 1984.*
Tjong, S.C., "Nanocrystalline Materials: Their Synthesis-Structure-Property Relationships and Applications," Elsevier, Jun. 23, 2006, p. 323.*
A. Burger et al., "The Role of Polyethylene in Platelet Growth of Mercuric Iodide," Journal of Crystal Growth, 56, North-Holland Publishing Company, dated 1982, pp. 526-531.
Samuel P. Faile, "Mercuric Iodide (HG12) Platelets for X-Ray Spectroscopy Produced by Polymer Controlled Growth," Journal of Crystal Growth, 50, North-Holland Publishing Company, dated 1980, pp. 752-756.
A. Burger et al., "Yield and Quality of HGI2 Vapor Grown Platelets," Journal of Crystal Growth, 72. North-Holland Publishing Company, dated 1985, pp. 643-648.
Jan Przyluski et al., "α-HGI2 Platelets Technology," Nuclear Instruments and Methods in Physics Research, A283, North-Holland, Amsterdam, dated 1989, pp. 144-148.
Kazimierz Conder et al., "The Vapour Transport Mechanism During Crystallization of HGI2 In Closed Ampoules," Nuclear Instruments and Methods in Physics Research, A283, North-Holland, Amsterdam, dated 1989, pp. 138-143.
Ariesanti et al., "Research Project Highlights," Semiconductor Materials and Radiological Technologies Laboratory, Kansas State University, 2009 Yearly Report, pp. 12-13 (possibly available May 26, 2010).

\* cited by examiner

PROCESS OF FORMING A CRYSTAL HAVING A PARTICULAR SHAPE AND THE CRYSTAL FORMED BY THE PROCESS

CROSS-REFERENCE TO RELATED APPLICATION

This application claims priority under 35 U.S.C. §119(e) to U.S. Patent Application No. 61/574,862 entitled "Organic Assisted Vapor Phase Semiconductor Crystal Growth," by Ariesanti et al., filed Aug. 10, 2011, which is incorporated herein by reference in its entirety.

STATEMENT REGARDING FEDERALLY SPONSORED RESEARCH OR DEVELOPMENT

This invention was made under Contract Number HDTRA1-07-1-0007 between Kansas State Board of Regents and the Defense Threat Reduction Agency of the U.S. Department of Defense. The government has certain rights in the invention.

BACKGROUND

Field of the Disclosure

The following is directed to crystals, and more particularly to processes of forming crystals having particular shapes and the crystals formed by such processes.

Description of the Related Art

Crystals can be formed using vapor processes. The crystals can be characterized by crystal planes, and surfaces of the crystals may be grown along such crystal planes. Further improvements in crystal growth, performance from less surface irregularities, or both are desired.

BRIEF DESCRIPTION OF THE DRAWINGS

Embodiments are illustrated by way of example and are not limited by the accompanying figures.

Figure 1:
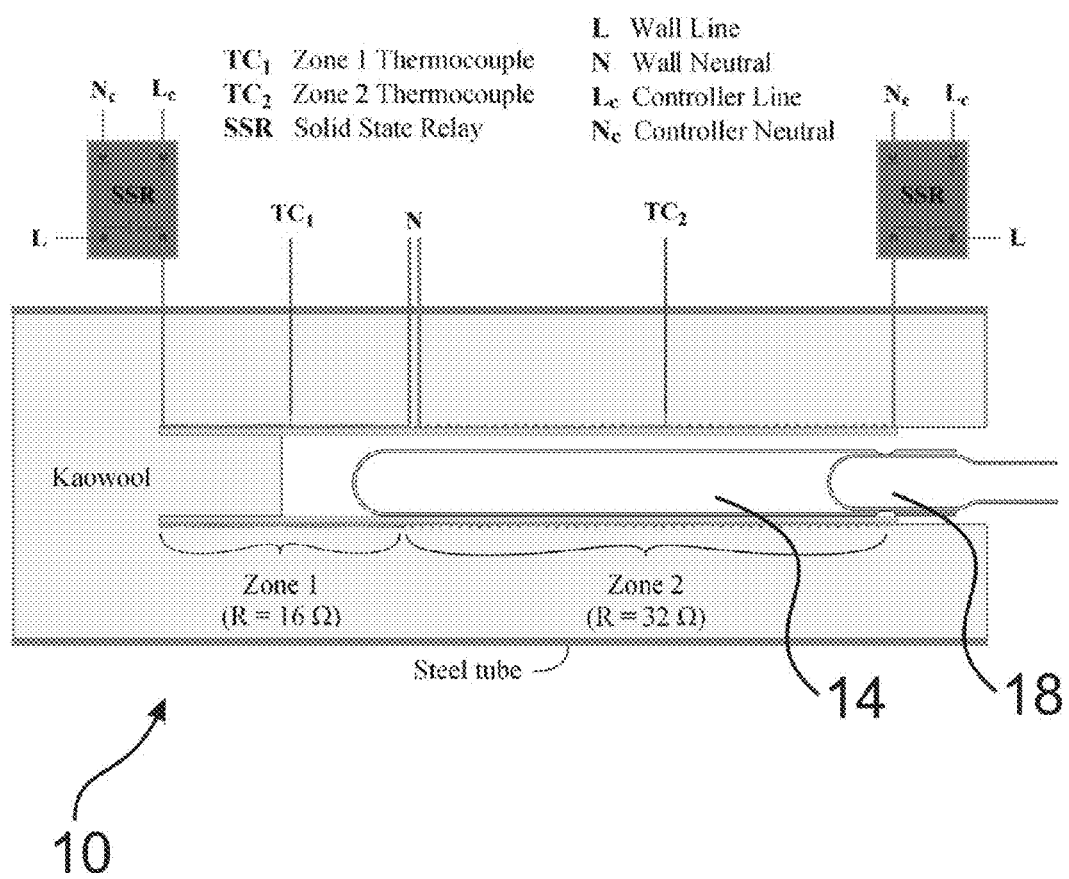
FIG. 1 includes a schematic depiction of a two-zone furnace and a chamber sealed with a stopper within the furnace.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention. The use of the same reference symbols in different drawings indicates similar or identical items.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

The term, "assist material" is intended to mean a material, which when used with a constituent of a crystal, that alters the vapor growth of the crystal, such that the growth rate along a particular surface is different than the growth rate along a different surface.

The term "constituent," when referring to a composition, is intended to mean any one or more elements that make up a composition, including the composition itself. For example, a constituent of $HgI_2$ includes Hg, I, or $HgI_2$.

As used herein, the terms "comprises," "comprising," "includes," "including," "has," "having," or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

The use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the crystal, semiconductor, scintillation, and radiation detection arts.

A crystal can be formed using vapor deposition. In one set of embodiments, the crystal can be grown such that the crystal is selectively grown along a surface substantially along a crystal plane in preference to another surface substantially along a different crystal plane. In a further set of embodiments, the crystal can be vapor grown in the presence of an assist material that is attracted to a particular location of the crystal to reduce crystal growth at a region adjacent to the location. In a particular embodiment, the assist material may be preferentially attracted to or preferentially repelled from a particular surface of the crystal that is substantially along a crystal plane as compared to another surface substantially along a different crystal plane. The assist material may have a locally greater net charge that is attracted to or repelled from a net charge at a particular location within the crystal. Even with the locally greater net charge, the assist material may have an overall neutral charge. The assist material may be an organic material, such as an oxygen-containing organic material. The oxygen-containing organic material can include a carbonyl group, such as a ketone.

The position of the net charge or oxygen atom within the assist material may affect which crystal surfaces attract or repel the material. In a particular embodiment, a ketone having its carbonyl group near an end of the assist material may be preferentially attracted to or preferentially repelled from a surface substantially along a particular crystal plane, and a different ketone having its carbonyl group in the middle of relatively long material (e.g. greater than 10 carbon atoms) may be preferentially attracted to or preferentially repelled from another surface substantially along a different crystal plane. An as-grown crystal can be formed that has a geometric shape that is tailored for a particular application. Without any assist material, the as-grown crystal may have a relatively random shape. Thus, a desired (or predetermined) shape may be achieved when an appropriate assist material is used. With a particular assist material, the as-grown shape may have a substantially platelet shape, and with a different particular assist material, the as-grown shape may have a substantially prismatic shape. After reading this specification, skilled artisans will appreciate that other shapes may be achieved, and the particular assist material used may depend on the composition of the crystal and the desired shape. The concepts are discussed below in more detail, and the present invention is not limited solely to the embodiments described herein.

The crystal can include a metal halide. In a particular embodiment, the crystal can include $HgI_2$, $PbI_2$, $BiI_3$, $TlBr$, or the like. In another embodiment, the crystal may not be a halide. In another embodiment, the crystal can include HgCdTe.

The selection of source material for the crystal depends on a number of factors, including the composition of the crystal, potential phases of the material and the stability of such phases, availability and purity of source materials, and the like. Reagent grade source materials may have sufficient purity. If the source materials do not have sufficient purity, the source materials may be further processed to obtain the desired purity. In an embodiment, the source material can have the same elements as the composition of the crystal. For example, if the crystal includes $HgI_2$, the source material can include $HgI_2$.

The assist material may increase the growth rate along a surface substantially along a particular crystal plane, decrease the growth rate along a surface substantially along a different crystal plane, or both. The assist material may help to transport a vapor species of a constituent of the crystal more quickly to a surface that is substantially along a particular crystal plane, hinder transport of the vapor species to a surface that is substantially along a different crystal plane, or both. The assist material may help to deposit a vapor species of a constituent of the crystal more quickly at a surface that is substantially along a particular crystal plane, inhibit depositing of the vapor species to a surface that is substantially along a different crystal plane, or both.

The assist material may affect constituent transport or deposition more indirectly. For example, the crystal being formed may have a net charge of a particular polarity at a particular location. The assist material can have a net charge at a particular location within the material, wherein the net charge of the assist material has the same polarity as the surface in which case the assist material is repelled. Thus, vapor species of the constituent of the crystal may have easier access to a region at and adjacent to the location as compared to another location where the assist material is not repelled. Thus, the assist material may help to enhance the crystal growth at a region adjacent to the particular location.

In another example, the crystal being formed may have a net charge of a particular polarity at a particular location. The assist material can have a net charge at a particular location within the material, wherein the net charge of the assist material has an opposite polarity that is attracted to the particular location of the crystal. The assist material may help to reduce the crystal growth at a region at and an adjacent to the particular location. Thus, a vapor species of a constituent of the crystal may have more difficult access to a region at and adjacent to the location as compared to another location where the assist material is not attracted. Thus, the assist material may help to reduce the crystal growth at a region adjacent to the particular location. When attracted, the assist material and a particular surface of the crystal may be held together by van der Waals forces.

In another particular embodiment, the assist material can be an organic material. In a more particular embodiment, the organic material can include an oxygen atom, such as in a carbonyl group. The molecular weight of the organic material may not be greater than approximately 700.

In a particular embodiment, the organic material has a chemical formula of:

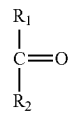

wherein each of $R_1$ and $R_2$ has at least two carbon atoms.

The position of the dipole or carbonyl group within the assist material can affect which crystal planes are affected. For example, an ethyl alkyl ketone may allow particular growth rates at surfaces substantially along a particular set of crystal planes, and an alkyl alkyl ketone having a carbonyl group at least 10 carbon atoms away from the ends of the molecule may allow different growth rate along the same surfaces or allow for the same or different growth rates along other surfaces substantially along a different set of crystal planes. Thus, the assist material used can be selected from a plurality of assist materials that have different positions of dipoles or oxygen atoms that are preferentially attracted to or repelled from surfaces substantially along particular crystal planes of the crystal.

Still another mechanism may occur. Further, any combination of the foregoing mechanisms may occur. The present invention is defined by the claims and is not limited to any particular mechanism.

Regardless of mechanism, little or substantially no crystal growth may occur along surfaces substantially along less preferred crystal planes. The crystal can have a ratio of the total surface area of surfaces substantially along more preferred planes to the total surface area of surfaces substantially along less preferred planes that is at least approximately 5:1. In another embodiment, the ratio may be at least approximately 11:1, at least approximately 50:1, at least approximately 200:1, at least approximately 500:1, or at least approximately 1100:1. In an embodiment, the more preferred planes are substantially perpendicular or substantially parallel to each other, and the less preferred planes are not perpendicular or parallel to the more preferred planes. In an embodiment, a rectilinear shaped crystal may be desired, and growth along a less preferred plane may result in a chamfer. Some chamfer may be desired so the edges of the crystal are not as sharp; however, the chamfer may be limited to allow sufficient useful area along the desired planes.

One assist material may allow an as-grown crystal to be formed having a substantially platelet shape. The as-grown crystal can have a first dimension, a second dimension, and a third dimension, wherein the first, second and third dimensions are substantially perpendicular to each other, the value of the first dimension is greater than the value of the third dimension, and each value of the first dimension and the second dimension is greater than the value of the third dimension. The second dimension may have a value that is the same or less than the value of the first dimension. In a particular embodiment, each value of the first dimension and the second dimension is at least approximately 1.1, at least approximately 1.5, at least approximately 2, at least approximately 3, or at least approximately 5 times the value of the third dimension. In more particular embodiment, the value of the first dimension is no greater than approximately 5, no greater than approximately 3, no greater than approximately 2 times, no greater than approximately 1.5, or no greater approximately 1.1 times the value of the second dimension.

In a particular embodiment, a crystal has a size of 3×3×1 mm. In this embodiment, the first dimension has a value 3 mm, the second dimension has a value of 3 mm, and the third dimension has a value of 1 mm. The value of the first dimension is 3 times the value of the third dimension, and the value of the second dimension is 3 times value of the third dimension. In another particular embodiment, a crystal has a size of 10×10×1 mm. The value of the first dimension is 10 times the value of the third dimension, and the value of the second dimension is 10 times the value of the third dimension. In a further particular embodiment, a crystal has a size of 10×5×1 mm. The value of the first dimension is 10 times the value of the third dimension, and the value of the second dimension is 5 times the value of the third dimension.

A different assist material may allow an as-grown crystal of the same composition to be formed having a substantially prismatic shape. The as-grown crystal can have a first dimension, a second dimension, and a third dimension, wherein the first, second and third dimensions are substantially perpendicular to each other, the value of the first dimension is greater than a value of the third dimension, and a value of the first dimension is greater than each value of the second dimension and the third dimension. In a particular embodiment, the value of the first dimension is at least approximately 1.1, at least approximately 1.5, at least approximately 2, at least approximately 3, or at least approximately 5 times each value of the second dimension and the third dimension. In another particular embodiment, the value of the second dimension is no greater than approximately 5, no greater than approximately 3, no greater than approximately 2 times, no greater than approximately 1.5, or no greater approximately 1.1 times the value of the third dimension.

In a particular embodiment, a crystal has a size of 10×1×1 mm. The value of the first dimension is 10 times the value of the third dimension, and the value of the first dimension is 10 times value of the second dimension. In another particular embodiment, a crystal has a size of 10×5×1 mm. The value of the first dimension is 10 times the value of the third dimension, and the value of the first dimension is 5 times the value of the second dimension.

In a particular embodiment, during crystal growth of $HgI_2$, 3-hexadecanone can be attracted more to surfaces substantially along the (001) planes of $HgI_2$ as compared to other surfaces substantially along the {110} or {h0l} planes, or alternatively, 3-hexadecanone can be repelled more by surfaces substantially along the {110} or {h0l} planes of $HgI_2$ as compared to other surfaces substantially along the (001) planes of $HgI_2$. During crystal growth of $HgI_2$, 14-heptacosanone can be attracted more to surfaces substantially along the {110} planes of $HgI_2$ as compared to other surfaces substantially along the (001) or {h0l} planes of $HgI_2$, or alternatively, 14-heptacosanone can be repelled more by surfaces substantially along the (001) or {h0l} planes of $HgI_2$ as compared to other surfaces substantially along the {110} planes of $HgI_2$. After reading this specification, skilled artisans will understand that the particular crystal composition and phases and particular assist materials can affect the crystal growth rates along different surfaces. Thus, the description of $HgI_2$ crystals with 3-hexadecanone or 14-heptacosanone are used for illustration purposes and are not meant to limit the scope of the present invention.

The mass of the assist material to be used may depend on the particular assist material and the particular composition of the crystal. In an embodiment, the mass of the composition may be no greater than approximately 5 wt %, no greater than approximately 2%, or no greater than approximately 1% of the mass of the source material, and in another embodiment, the mass of the composition may be at least approximately 0.02 wt % or at least approximately 0.1% of the mass of the source material.

The crystal can be formed using a vapor growth technique within a furnace. In a particular embodiment, a horizontal furnace can be used. FIG. 1 includes a schematic depiction of a furnace 10 that is a two-zone horizontal furnace that includes Zone 1 and Zone 2. Heat within Zone 1 is controlled by a heating element coupled to a solid-state relay ("SSR"), and the temperature is monitored by a thermocouple, TC1. Heat within Zone 2 is controlled by a different heating element coupled to a different SSR, and the temperature is monitored by a different thermocouple, TC2. Thus, the temperature in Zones 1 and 2 can be independently controlled. A controller (not illustrated) can be used to receive data from TC1 and TC2 and send control signals to the SSRs. Temperature control to within 0.1° C. can be achieved. During operation, a chamber 14 and a stopper 18 can be disposed within the furnace 10.

Before inserting the chamber 14 into the furnace, the source material and an assist material can be introduced into the chamber. In a particular embodiment, a seed crystal can be introduced within the chamber 14. The particular source material, particular assist material, and masses of each may depend on the composition of the crystal, and the geometric shape to be achieved and mass for the as-grown crystal. After introducing the source material and assist material, the chamber 14 can be evacuated and backfilled with $N_2$ to remove substantially all air from the chamber. A final evacuation is performed prior to sealing the chamber. The pressure during chamber sealing or growth may be on the order of $10^{-4}$ Torr. The actual pressure during growth may vary depending on the source material, the assist material, composition of phase of the crystal, or any combination thereof. The stopper 18 can be placed over the open end of the chamber 14 to seal the source material and assist material within the chamber 14.

The chamber 14, with the source material and assist material, and the stopper 18 are inserted into the furnace 10. The source material and assist material will initially lie within Zone 1 of the furnace 10. A relatively small amount or substantially none of the source material or assist material is within Zone 2.

The temperatures used for the growth process may depend on the source material, the assist material, composition or phase of the crystal, or any combination thereof. In a particular embodiment, α-phase $HgI_2$, and not β-phase $HgI_2$, is to be formed. At about 126° C., $HgI_2$ can undergo a phase transition from α-phase $HgI_2$ to β-phase $HgI_2$. When α-phase HgI$_2$ crystal is being formed, the temperature of Zone 2 is at a temperature lower than 126° C. In an embodiment, Zone 1 is at a temperature lower than 126° C., too. In a particular embodiment, each of Zones 1 and 2 is at a temperature no higher than approximately 100° C. Other temperatures may be used for HgI$_2$ or other compositions or phases of the crystal being grown.

In a particular embodiment, the furnace 10 can be operated so that Zone 1 has a higher temperature compared to Zone 2. The temperature differential can allow a portion of the source material and assist material to vaporize in Zone 1 and the crystal to be grown in Zone 2. In an embodiment, the temperature differential can be in a range of 10° C. to 20° C. For growing an α-phase HgI$_2$ crystal, Zone 1 can be at approximately 100° C., and Zone 2 can be at a temperature in a range of approximately 80° C. to approximately 90° C. The temperature differential used for the growth process may depend on the source material, the assist material, composition or phase of the crystal, or any combination thereof. Thus, the values provided in this paragraph are meant to be illustrative and not limit the scope of the present invention.

Similar to other operating parameters, the time of the crystal growth may depend on the source material, the assist material, composition or phase of the crystal, or any combination thereof. In addition, the time may depend on the mass of the crystal being grown, and thus, the time of the crystal growth may be determined by empirical techniques.

During the crystal growth process, a crystal is formed within the chamber 14. The surfaces of the crystal lie substantially along the crystal planes of the crystal. In an embodiment, an assist material may affect the growth rates along surfaces of the crystal. The assist material may help or hinder relative growth rates along different surfaces of the crystal. In a particular embodiment, the assist material may help with transport of vapor species of a constituent of the crystal to the surface. In another embodiment, the assist material may be repelled more preferentially from one or more surfaces that are along substantially along particular crystal planes of the crystal, as compared to other surfaces that are along other crystal planes of the crystal. The assist material may make it easier for the vapor species to reach the surfaces of the crystal to which the assist material is repelled. Thus, growth along surfaces where there is repulsion with respect to the assist material can proceed at a greater rate. In a further embodiment, the assist material may be attracted more preferentially to one or more surfaces that are along substantially along particular crystal planes of the crystal, as compared to other surfaces that are along other crystal planes of the crystal. The assist material may make it more difficult for the vapor species to reach the surfaces of the crystal to which the assist material is attracted. Thus, growth along surfaces where there is little or no attraction to the assist material can proceed at a greater rate. The shape of the crystal may be at least in part determined by which crystal planes are associated with a higher growth rate and other crystal planes with substantially no or a smaller growth rate. In a particular embodiment, when a seed crystal is used, the crystal is vapor grown from the seed crystal.

Without the assist material, crystal growth along the different crystal planes may not be controlled, and a variety of different shapes of the crystal may result. By using an appropriate assist material, a desired shape of the crystal may be achieved and be more reproducible. Even with the same source material and crystal composition and phase, different assist materials may result in different shapes. For example, an α-phase HgI$_2$ crystal may have a more platelet shape when the assist material includes 3-hexadecanone and have a more prismatic shape when the assist material includes 14-heptacosanone. The effect of the assist material on the crystal shape is not limited to α-phase HgI$_2$ crystal and the particular assist materials disclosed. After reading the specification, skilled artisans will be able to determine which assist materials affect the shapes of crystals having a particular compositions and phases.

After the crystal growth is completed, the crystal can be removed from the chamber. The assist material is not incorporated into the lattice sites of the crystal. Thus, the crystal is substantially free of the assist material.

Figure 2:
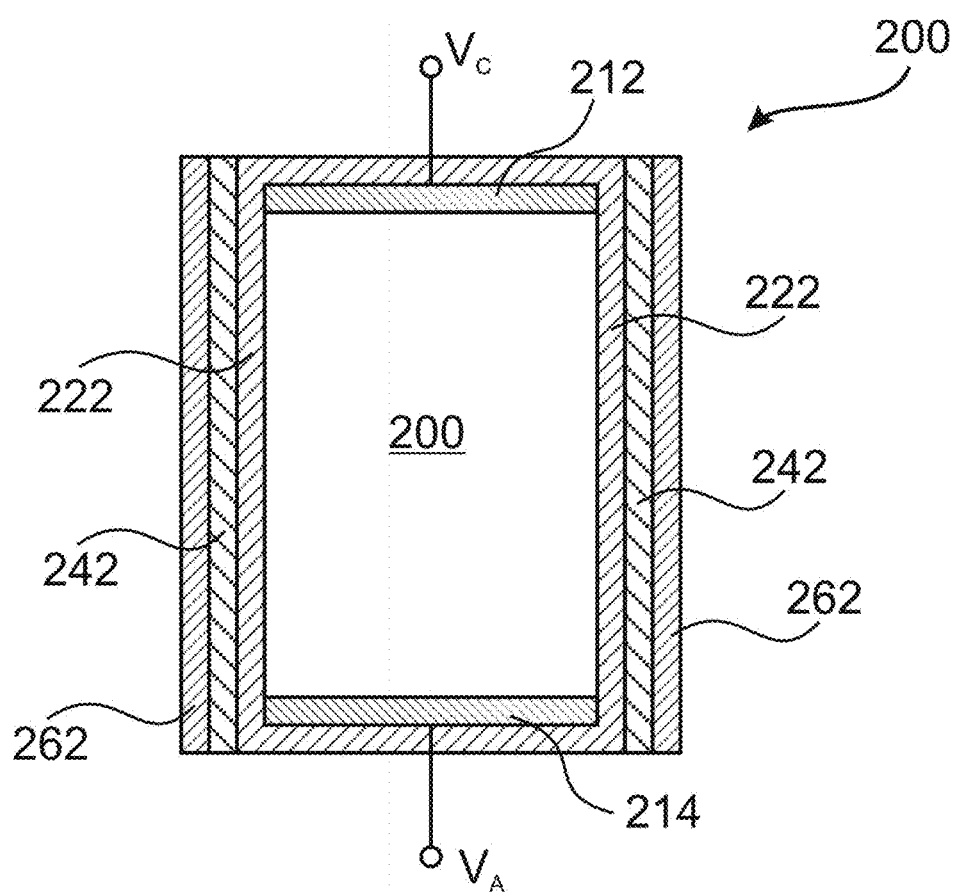
FIG. 2 includes a cross-sectional view of a Frisch collar sensing apparatus including a crystal formed in accordance to with a particular embodiment.

The crystal formed using any or the process as described herein can be used in a radiation sensing apparatus. In a particular embodiment, the crystal can be used in a Frisch collar sensing apparatus. Referring to FIG. 2, the crystal 200 has an electrode 212 along one end of the crystal 200 and another electrode 214 along an opposite end of the crystal. In an embodiment, the electrodes 212 and 214 may be electrically connected to surfaces that provide for the highest carrier mobility, such as electron mobility, from the electrode 212 to the electrode 214 or vice versa. In another crystal, hole mobility may be more significant in a particular application, and thus, the highest hole mobility may be desired. In a particular embodiment where the crystal has a tetragonal crystal structure, such as HgI$_2$, and where high electron mobility is desired, the electrodes 212 and 214 can be electrically connected to surfaces substantially along the (001) crystal planes of the crystal 200. In another particular embodiment where the crystal has a hexagonal crystal structure, such as PbI$_2$ and BiI$_3$, and where high electron mobility is desired, the electrodes 212 and 214 can be electrically connected to surfaces substantially along the (001) crystal planes of the crystal 200. The electrode 212 can be coupled to a cathode terminal to provide a cathode voltage ($V_C$), and the electrode 214 can be coupled to an anode terminal to provide an anode voltage ($V_A$). In an embodiment, the electrode 212, the electrode 214, or both electrodes can include colloidal carbon. The combination of the crystal 200 and electrodes 212 and 214 are encapsulated within an insulating layer 222. In an embodiment, the insulating layer 222 can include parylene. A conductive collar 262 surrounds the insulating layer 222. In an embodiment, the conductive collar 262 can include copper. If needed or desired, an intermediate layer 242 can be used. In an embodiment, the intermediate layer can include polytetrafluoroethylene. Although specific materials have been described, after reading the specification, skilled artisans will appreciate that other materials may be substituted for the electrodes 214, the insulating layer 222, the conductive collar 262, and, if present, the intermediate layer 242.

During operation, targeted radiation, such as gamma rays, can be captured by the crystal 200 and generate electron-hole pairs. The holes migrate towards the electrode 212, and the electrons migrate towards the electrode 214. Although not illustrated, a multichannel analyzer, a control module or other electronic device can receive a pulse from one or both electrodes 212 and 214 and process the signal to provide an energy spectrum, a radiation count, or other information.

The concepts as described herein are useful in forming crystals. The shape of an as-grown crystal can be modified by affecting the growth rates along different surfaces associated with different crystal planes. The ability to grow an as-grown crystal having a desired shape can help to reduce or substantially eliminate post-growth shaping operations. Thus, for crystals of substantially the same composition, a crystal having a substantially platelet shape or a substantially prismatic shape may be obtained. In another embodiment, growth along a surface substantially along a less preferred plane may be substantially eliminated. In still a further embodiment, some chamfering of the as-grown may be desired, even though the chamfer may be along a surface substantially along a less preferred crystal plane. The chamfering can be helpful in rounding otherwise sharp corners. The amount of chamfering may be limited so as to not occupy too much surface area, as compared to the major and side surfaces of the platelet.

The use of particular assist materials is believed to help achieve an as-grown crystal having a desired shape. The particular assist materials can affect the relative growth rates of surfaces substantially along different crystal planes. A particular assist material may help in transport of the vapor species of the constituent to surfaces substantially along only particular crystal planes. The particular assist material may have a localized net charge that allows the particular assist material to be preferentially attracted to or preferentially repelled by a localized net charge along a surface that is along a specific crystal plane. The particular assist material may help to reduce (when attracted) or increase (when repelled) the growth rate of the crystal along that particular surface. The preferential attraction may be caused by dipole-dipole interaction. An organic material, such as one that includes an oxygen atom (e.g., a carbonyl group), may be useful in controlling the shape of the as-grown crystal. As will be demonstrated in the examples, even within the same family of materials (e.g., ketones), the position of the oxygen atom within different materials can affect different surfaces along different crystal planes for different crystals of substantially the same composition.

Many different aspects and embodiments are possible. Some of those aspects and embodiments are described herein. After reading this specification, skilled artisans will appreciate that those aspects and embodiments are only illustrative and do not limit the scope of the present invention.

Note that not all of the activities described above in the general description or the examples are required, that a portion of a specific activity may not be required, and that one or more further activities may be performed in addition to those described. Still further, the order in which activities are listed is not necessarily the order in which they are performed.

EXAMPLES

The concepts described herein will be further described in the Examples, which do not limit the scope of the invention described in the claims. The Examples demonstrate that different assist materials affect crystals of substantially the same composition differently to allow different shapes of as-formed crystals to be obtained. The crystals were grown using a two-zone furnace, such as furnace 10 as illustrated in FIG. 1 and described above.

Example 1

3-Hexadecanone

In Example 1, 3-hexadecanone is used as an assist material in forming an $HgI_2$ crystal. The chamber is charged with approximately 40 g of $HgI_2$ and 0.1 wt % 3-hexadecanone. The chamber is evacuated and backfilled with $N_2$, and the final chamber pressure before inserting the chamber into the furnace is about $10^{-4}$ Torr with a stopper. Zone 1 of the furnace is at approximately 100° C., and Zone 2 is at approximately 80° C. The chamber with the $HgI_2$ and 3-hexadecanone are inserted into the furnace so that the $HgI_2$ and 3-hexadecanone are initially within Zone 1. The sealed chamber is kept in the furnace for approximately five days.

Figure 3:
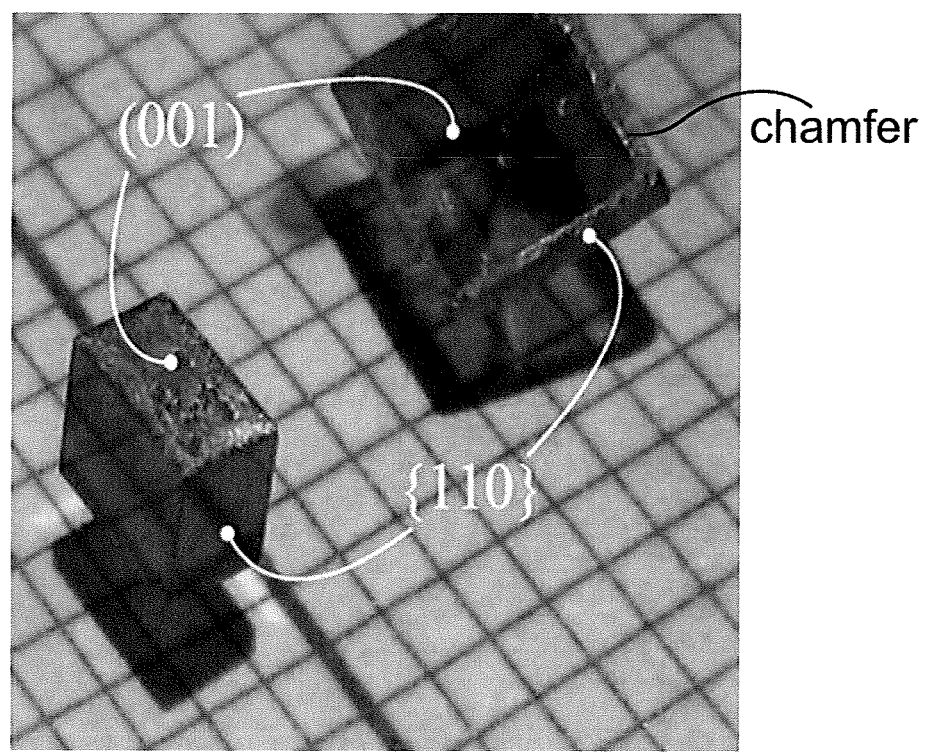
FIG. 3 includes a photograph of $HgI_2$ crystals formed in the presence of 3-hexadecanone in accordance with an embodiment.

FIG. 3 includes a photograph of as-grown $HgI_2$ crystals grown in the presence of 3-hexadecanone. The crystals have surfaces substantially along the (001) and {110} crystal planes, and relatively small surfaces or no surfaces along the {h0l} crystal planes. Because 3-hexadecanone is more strongly attracted to surfaces substantially along the (001) crystal planes than to surfaces substantially along the {110} crystal planes, the surfaces substantially along the (001) crystal planes have more surface area as compared to surfaces substantially along the {110} crystal planes. The crystal closer to the upper right-hand corner of FIG. 3 has a substantially platelet shape and a chamfer. The chamfer is relatively small and allows the major surfaces (top and bottom surfaces as illustrated in FIG. 3) to make up most of the area when viewing the crystal substantially perpendicular to the major surfaces. The major and side surfaces are substantially along more preferred crystal planes, and the chamfer is substantially along a less preferred crystal plane. Thus, Example 1 demonstrates that a substantially platelet shape can be achieved with an as-grown $HgI_2$ crystal, and that chamfering, if any, may occur to an acceptable level.

Example 2

14-Heptacosanone

In Example 2, 14-heptacosanone is used as an assist material in forming an $HgI_2$ crystal. The materials and conditions for Example 2 are substantially the same as Example 1 except 3-hexadecanone is replaced by 0.1 wt % 14-heptacosanone.

Figure 4:
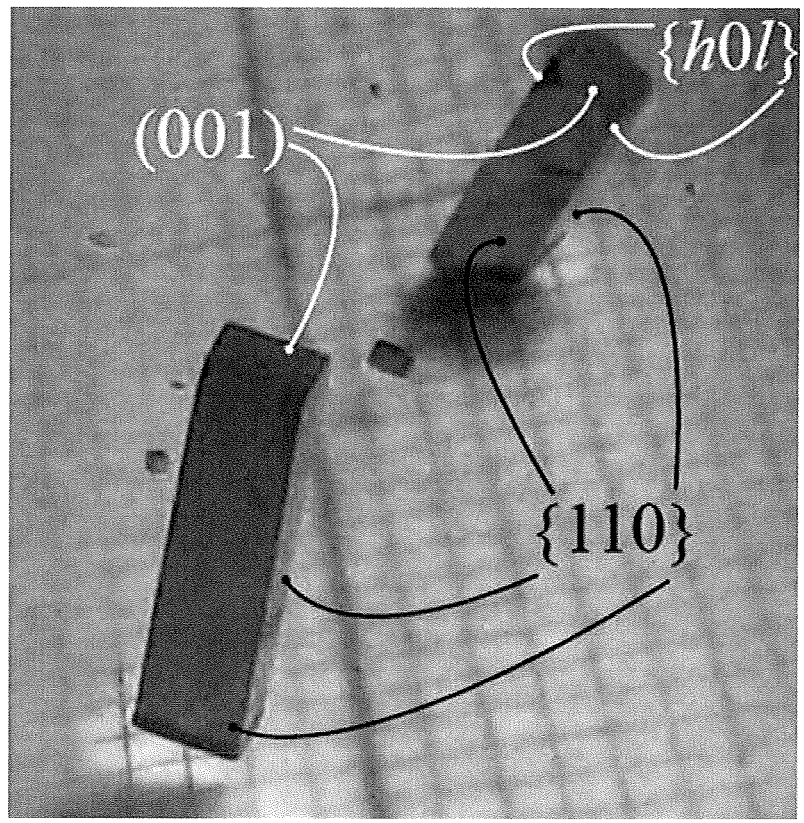
FIG. 4 includes a photograph of $HgI_2$ crystals formed in the presence of 14-heptacosanone in accordance with a further embodiment.

FIG. 4 includes a photograph of as-grown $HgI_2$ crystals grown in the presence of 14-heptacosanone. Similar to Example 1, the crystals have surfaces substantially along the {110} crystal planes, and relatively small surfaces or no surfaces along the (001) and {h0l} crystal planes. The crystal closer to the lower left-hand corner of FIG. 4 has a substantially tetragonal prismatic shape. Thus, Example 2 demonstrates that a substantially tetragonal prismatic shape can be achieved with an as-grown $HgI_2$ crystal. Further, Examples 1 and 2 demonstrate that the shape of the crystal may be changed by using a different assist material.

Comparative Example

No Assist Material

In the Comparative Example, no assist material was used when forming an $HgI_2$ crystal. The materials and conditions for the Comparative Example are substantially the same as Example 1 except 3-hexadecanone is not used.

Figure 5:
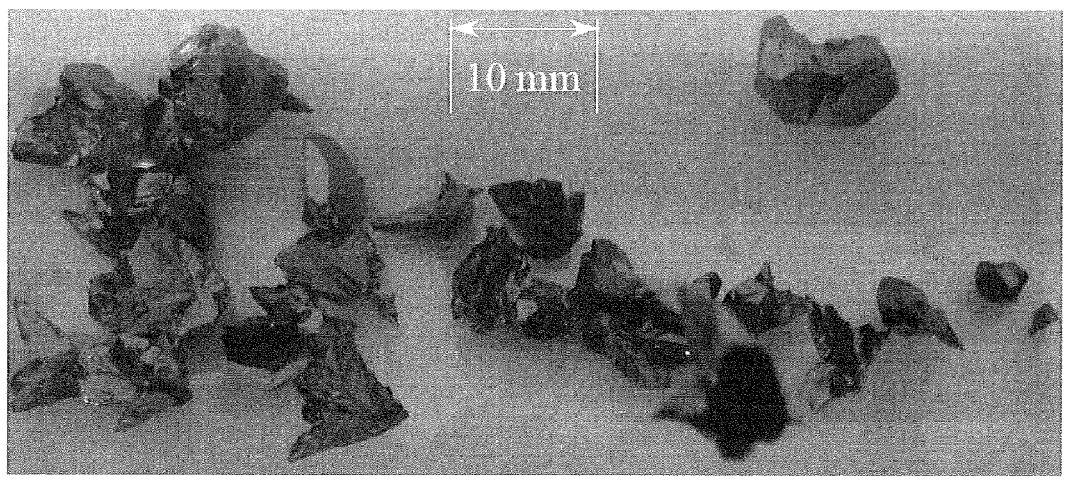
FIG. 5 includes a photograph of $HgI_2$ crystals formed without an assist material.

FIG. 5 includes a photograph of as-grown $HgI_2$ crystals grown without an assist material. The crystals are usually twinned and have a variety of irregular shapes.

Certain features that are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A process of forming a crystal that can have a plurality of crystal planes including a first plane and a second plane, the process comprising:
    introducing into a chamber a source material that includes a metal halide and provides a constituent of the crystal and an organic material that includes a ketone and assists in growing the crystal along the first plane of the crystal at a faster rate as compared to the second plane of the crystal;
    vaporizing the source material including the metal halide and the organic material including the ketone; and
    while the source material including the metal halide and the organic material including the ketone are vaporized, vapor growing the crystal such that the crystal grows along a first surface substantially along the first plane at a relatively faster rate as compared to a second surface substantially along the second plane.

2. The process of claim 1, wherein the organic material including the ketone helps to transport a vapor species from the source material including the metal halide to the first surface at a relatively faster rate as compared to the second surface.

3. The process of claim 1, wherein the organic material including the ketone has a first dipole.

4. The process of claim 3, wherein during vapor growing, the organic material including the ketone is attracted to or repelled by a second dipole of the crystal.

5. The process of claim 4, wherein the second dipole is along the second plane of the crystal.

6. The process of claim 3, further comprises selecting the organic material from a plurality of assist materials, including the organic material that includes the ketone, having dipoles to achieve a predetermined shape of the crystal, wherein different positions of the dipoles within the assist materials provide for growth of the crystal into different shapes.

7. The process of claim 1, wherein the organic material including the ketone has a chemical formula of

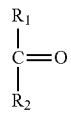

wherein each of R1 and R2 has at least two carbon atoms.

8. The process of claim 1, wherein the crystal comprises a $HgI_2$.

9. The process of claim 1, wherein the crystal comprises a $PbI_2$, a $BiI_3$, a TlBr, or a HgCdTe.

10. The process of claim 1, wherein the chamber has a vapor generation portion and a growth portion, and during vapor growing, the vapor generation portion is at a higher temperature than the growth portion.

11. The process of claim 10, wherein the vapor generation portion is at least approximately 1° C., at least approximately 2° C., or at least approximately 5° C. higher than the growth portion.

12. The process of claim 10, wherein the vapor generation portion is no greater than approximately 90° C., no greater than approximately 50° C., or no greater than approximately 30° C. higher than the growth portion.

13. The process of claim 10, wherein the vapor generation portion is in a range of approximately 10° C. to approximately 20° C. higher than the growth portion.

14. The process of claim 1, further comprising introducing a seed crystal within the chamber, wherein vapor growing comprises vapor growing the crystal from the seed crystal.

15. The process of claim 1, wherein the metal halide is a mercury halide.

16. A process of forming a crystal that can have a plurality of crystal planes including a first plane and a second plane, the process comprising:
    introducing into a chamber a source material that provides a constituent of the crystal and an organic material, wherein the organic material comprises 3-hexadecanone or 14-heptacosanone and assists in growing the crystal along the first plane of the crystal at a faster rate as compared to the second plane of the crystal;
    vaporizing the source material and the organic material comprising 3-hexadecanone or 14-heptacosanone; and
    vapor growing the crystal such that the crystal grows along a first surface substantially along the first plane at a relatively faster rate as compared to a second surface substantially along the second plane.

17. The process of claim 1, further comprises selecting the organic material including the ketone from a plurality of organic materials, including the organic material that includes the ketone, having oxygen atoms to achieve a predetermined shape of the crystal, wherein different positions of the oxygen atoms within the organic materials provides for growth of the crystal into different shapes.

18. The process of claim 1, wherein after introducing and before vapor growing, the chamber is substantially free of any organic material having a molecular weight greater than approximately 700.

19. The process of claim 1, further comprising removing the crystal from the chamber, wherein the crystal is substantially free of the organic material.

20. The process of claim 16, wherein the organic material is 3-hexadecanone and is attracted more to surfaces substantially along (001) planes of $HgI_2$ as compared to other surfaces substantially along {110} or {h0l} planes of $HgI_2$.

21. The process of claim 16, wherein the organic material is 3-hexadecanone and is repelled more by surfaces substantially along {110} or {h0l} planes of $HgI_2$ as compared to other surfaces substantially along (001) planes of $HgI_2$.

22. The process of claim 16, wherein the organic material is 14-heptacosanone and is attracted more to surfaces substantially along {110} planes of $HgI_2$ as compared to other surfaces substantially along (001) or {h0l} planes of $HgI_2$.

23. The process of claim 16, wherein the organic material is 14-heptacosanone and is repelled more by surfaces substantially along (100) or {h0l} planes of $HgI_2$ as compared to other surfaces substantially along {110} planes of $HgI_2$.

* * * * *